United States Patent [19]

Krautschneider

[11] Patent Number: 5,943,572
[45] Date of Patent: Aug. 24, 1999

[54] ELECTRICALLY WRITABLE AND ERASABLE READ-ONLY MEMORY CELL ARRANGEMENT AND METHOD FOR ITS PRODUCTION

[75] Inventor: Wolfgang Krautschneider, Hohenthann, Germany

[73] Assignee: Siemens Aktiengesellschaft, Munich, Germany

[21] Appl. No.: 08/952,168

[22] PCT Filed: Jul. 2, 1996

[86] PCT No.: PCT/DE96/01171

§ 371 Date: Nov. 6, 1997

§ 102(e) Date: Nov. 6, 1997

[87] PCT Pub. No.: WO97/03469

PCT Pub. Date: Jan. 30, 1997

[30] Foreign Application Priority Data

Jul. 10, 1995 [DE] Germany .............................. 195 25 070

[51] Int. Cl.$^6$ .......................... H01L 29/788; H01L 29/06
[52] U.S. Cl. ........................... 438/259; 257/315; 257/622
[58] Field of Search .................................. 257/315, 316, 257/622; 438/259

[56] References Cited

U.S. PATENT DOCUMENTS

| 4,814,840 | 3/1989 | Kameda | 257/316 |
| 5,306,941 | 4/1994 | Yoshida | 257/390 |
| 5,485,027 | 1/1996 | Williams et al. | 257/343 |
| 5,514,890 | 5/1996 | Yang et al. | 257/321 |
| 5,610,419 | 3/1997 | Tanaka | 257/315 |

FOREIGN PATENT DOCUMENTS 0 673 070 A2  9/1995  European Pat. Off. .

OTHER PUBLICATIONS

Academic Press, Inc., (1984), vol. 8, Plasma Processing for VLSI, Edited by Norman G. Einspruch et al, VLSI Electronics Microstructure Science, pp. 124–127.

*Primary Examiner*—Olik Chaudhuri
*Assistant Examiner*—Howard Weiss
*Attorney, Agent, or Firm*—Hill & Simpson

[57] ABSTRACT

An electrically writable and erasable read-only memory cell arrangement having memory cells. Each of the memory cells having an MOS transistor having a floating gate (6"). The MOS transistors are arranged in rows which run parallel. Adjacent rows run in each case alternately on the bottom of longitudinal trenches (4) and between adjacent longitudinal trenches (4). An area requirement for each memory cell of $2F^2$ (F: minimum structure size) is achieved by self-aligning process steps.

3 Claims, 4 Drawing Sheets

10

ELECTRICALLY WRITABLE AND ERASABLE READ-ONLY MEMORY CELL ARRANGEMENT AND METHOD FOR ITS PRODUCTION

BACKGROUND OF THE INVENTION

Read-only memory cell arrangements having electrically writable and electrically erasable read-only memory cells using silicon technology, so-called flash EEPROMs, are required for many applications. These flash EEPROM arrangements retain the stored data even without a voltage supply.

In technical terms, these memory cells are mainly realized by an MOS transistor, which has, on the channel region, a first dielectric, a floating gate, a second dielectric and a control gate. If a charge is stored on the floating gate, then it influences the threshold voltage of the MOS transistor. In such a memory cell arrangement, the state "charge on the floating gate" is assigned to a first logic value and the state "no charge on the floating gate" is assigned to a second logic value. The information is written to the memory cells by means of a Fowler/Nordheim tunnelling current, by which electrons are injected onto the floating gate. The information is erased by a tunnelling current in the opposite direction through the first dielectric.

In memory cell arrangements of this type, the MOS transistors are constructed as planar MOS transistors and are arranged in a planar cell architecture. As a result, the theoretical minimum area requirement of a memory cell is $4F^2$, where F is the smallest structure size that can be produced with the respective technology. Flash EEPROM arrangements of this type are currently offered for volumes of data of at most 64 Mbits.

Larger volumes of data can currently be stored in a writable and erasable manner only in dynamic memory cell arrangements (DRAM) or on magnetic data media. A DRAM continually requires a voltage supply in order to retain the stored data. Magnetic data media, on the other hand, are based on mechanical systems with rotating storage media.

The invention is based on the problem of specifying an electrically writable and erasable read-only memory cell arrangement which can be produced with a smaller area requirement for each memory cell. It is furthermore intended to specify a method for the production of such a memory cell arrangement.

SUMMARY OF THE INVENTION

This problem is solved according to the invention by means of an electrically writable and erasable read-only memory cell.

In general terms the present invention is an electrically writable and erasable read-only memory cell arrangement. A multiplicity of individual memory cells are provided in a region, doped by a first conductivity type, of a semiconductor substrate. The region doped by the first conductivity type is insulated from the semiconductor substrate. The memory cells are in each case arranged in rows which run essentially parallel. Longitudinal trenches, which run essentially parallel to the rows, are provided in a main area of the semiconductor substrate. The rows are in each case arranged alternately on the main area between adjacent longitudinal trenches and on the bottom of the longitudinal trenches. The memory cells each comprise at least one MOS transistor having source/drain regions which are doped by a second conductivity type opposite to the first, a first dielectric, a floating gate, a second dielectric and a control gate. Word lines, which are each connected to the control gates on MOS transistors arranged along different rows, run transversely with respect to the rows.

Advantageous developments of the present invention are as follows.

A heavily doped, $p^+$-doped layer is provided at the level of half the trench depth for the purpose of insulation between adjacent rows. The MOS transistors of memory cells arranged along a row are interconnected in series. The interconnected source/drain regions of MOS transistors, which are adjacent along a row, are constructed as a coherent doped region in the semiconductor substrate. Each row has two connections, between which the MOS transistors arranged in the row are interconnected in series.

The sides of the longitudinal trenches have bulges in the region of the trench bottom which are filled with insulating material.

The semiconductor substrate has monocrystalline silicon at least in the region of the region doped by the first conductivity type. The first dielectric is constructed in each case as an $SiO_2$ layer. The second dielectric in each case contains $SiO_2$ and/or $Si_3N_4$. The floating gate and the control gate each contain doped polysilicon.

The present invention is also a writable and erasable read-only memory cell arrangement. A region which is doped by a first conductivity type and is insulated from a semiconductor substrate is produced in a main area of the semiconductor substrate. Longitudinal trenches which run essentially parallel are etched in the main area within the region doped by the first conductivity type. A multiplicity of memory cells arranged in rows are produced, which memory cells each comprise at least one MOS transistor having source/drain regions which are doped by a second conductivity type opposite to the first, a first dielectric, a floating gate, a second dielectric and a control gate, the rows being arranged alternately on the main area between adjacent longitudinal trenches and on the bottom of the longitudinal trenches. A first dielectric layer is produced. A first doped polysilicon layer is produced and structured in such a way that strip-like first polysilicon structures are produced which are arranged parallel to the longitudinal trenches in each case on the main area between adjacent longitudinal trenches and on the bottom of the longitudinal trenches. A second dielectric layer is produced. Control gates and word lines which run transversely with respect to the rows and are each connected to the control gates of MOS transistors arranged along different rows are produced by deposition and anisotropic etching of a second polysilicon layer. The second dielectric layer and the first polysilicon structure are structured by anisotropic etching corresponding to the word lines. Source/drain implantation is effected for the MOS transistors, during which the word lines act as a mask. For the self-aligned structuring of the first polysilicon layer, spacers are formed on those parts of the first polysilicon layer which are arranged on the sides of the longitudinal trenches, by deposition and anisotropic etching, which is selective with respect to the semiconductor substrate, of a first auxiliary layer. A second auxiliary layer is produced selectively on exposed parts of the first polysilicon layer, it being possible to etch the first auxiliary layer and the first polysilicon layer selectively with respect to the said second auxiliary layer. The spacers are removed selectively with respect to the second auxiliary layer. The first polysilicon structure is formed by etching the first polysilicon layer while using the second auxiliary layer as an etching mask. The second auxiliary layer is then removed.

The second auxiliary layer is formed from thermal $SiO_2$ and the first auxiliary layer is formed from $Si_3N_4$ or from $SiO_2$ which can be etched selectively with respect to thermal $SiO_2$.

The longitudinal trenches are produced in such a way that their sides have bulges in the region of the trench bottom, by virtue of which bulges the width of the trench is greater in the region of the trench bottom than in the region of the main area. The bulges are filled with insulating material.

The longitudinal trenches are formed by combined anisotropic and isotropic etching.

The electrically writable and erasable read-only memory cell arrangement according to the invention is realized in a semiconductor substrate. The semiconductor substrate preferably has monocrystalline silicon at least in the region of the memory cell arrangement. In this case, the semiconductor substrate may comprise a monocrystalline silicon wafer as well as an SOI substrate.

Arranged in the semiconductor substrate is a region which is doped by a first conductivity type and adjoins a main area of the semiconductor substrate. The region doped by the first conductivity type is insulated from the semiconductor substrate, with the result that a voltage can be applied to the region doped by the first conductivity type. The insulation of the region doped by the first conductivity type from the semiconductor substrate may be a pn junction as well as a buried insulating layer, for example the buried insulating layer of an SOI substrate.

A multiplicity of individual memory cells are arranged in the region doped by the first conductivity type. In this case, the memory cells are in each case arranged in rows which run essentially parallel. Longitudinal trenches which run essentially parallel to the rows are provided on the main area of the semiconductor substrate. The rows are in each case arranged alternately on the main area between adjacent longitudinal trenches and on the bottom of the longitudinal trenches. That is to say that the memory cells are in each case arranged in two planes which are vertically offset relative to one another.

Each memory cell comprises an MOS transistor having source/drain regions which are doped by a second conductivity type opposite to the first, a first dielectric, a floating gate, a second dielectric and a control gate.

Running transversely with respect to the rows are word lines, which are each connected to the control gates of MOS transistors arranged along different rows.

The MOS transistors of memory cells arranged along a row are preferably interconnected in series. Interconnected source/drain regions of MOS transistors which are adjacent along a row are in this case constructed as a coherent doped region. Each row has two connections, between which MOS transistors arranged in the row are interconnected in series. The MOS transistors situated in the respective row can be driven in the sense of a NAND architecture or with random access via these connections. If the width of the longitudinal trenches, the spacing between adjacent longitudinal trenches, the extent of the coherent doped regions and the width of the word lines are designed in this embodiment to correspond to a minimum structure size F with the respective technology, then the area requirement for each memory cell is $2F^2$. If a technology having a minimum structure size F of 0.4 $\mu$m is used, a storage density of 6.25 bits/$\mu m^2$ can thus be achieved.

Adjacent rows are in each case insulated from one another by the sides of the longitudinal trenches. In order to avoid parasitic MOS transistors over the sides of the longitudinal trenches, the latter are provided with insulating spacers.

In order to improve the insulation effect of these spacers, it lies within the scope of the invention for the longitudinal trenches to have a greater width in the region of the trench bottom, by virtue of bulges in the sides in this region, than in the region of the main area. These bulges are filled with insulating material and increase the thickness of the insulating spacer in the region of the trench bottom. Another possibility for increasing the insulation between the main area and the trench bottom is to form a thin, heavily doped $p^+$-doped layer by ion implantation to a level halfway up the trench.

The space requirement for each memory cell of $2F^2$ is achieved in the production of the read-only memory cell arrangement according to the invention with the use of self-aligning process steps.

In order to produce the electrically writable and erasable read-only memory cell arrangement according to the invention, the region doped by the first conductivity type is first produced in the main area of the semiconductor substrate. Longitudinal trenches which run essentially parallel are etched in the main area within the region doped by the first conductivity type, which longitudinal trenches are at least as long as the rows. A first dielectric layer is subsequently produced. A first doped polysilicon layer is produced over the whole area and structured in such a way that strip-like first polysilicon structures are produced which are arranged parallel to the longitudinal trenches in each case on the main area between adjacent longitudinal trenches and on the bottom of the longitudinal trenches. A second dielectric layer is produced. Control gates and word lines which run transversely with respect to the rows are produced by deposition and anisotropic etching of a second polysilicon layer. The word lines are each connected to the control gates of MOS transistors arranged along different rows. The second polysilicon layer is preferably deposited to such a thickness that the word lines have a planar surface transversely with respect to the longitudinal trenches. The second dielectric layer and the first polysilicon structures are subsequently structured by anisotropic etching corresponding to the word lines. This is done, for example, using the same mask with which the word lines were structured. Source/drain implantation is effected for the MOS transistors, during which the word lines are used as a mask. The word lines are simultaneously doped during this implantation.

The first polysilicon layer is preferably structured by means of self-aligning process steps. In this case, spacers are formed on those parts of the first polysilicon layer which are arranged on the sides of the longitudinal trenches, by deposition and anisotropic etching of a first auxiliary layer. The anisotropic etching takes place selectively with respect to the substrate. The first auxiliary layer is formed, for example, from $SiO_3N_4$ or from $SiO_2$ which can be etched selectively with respect to thermal $SiO_2$. A second auxiliary layer is subsequently produced selectively on exposed parts of the first polysilicon layer, it being possible to etch the first auxiliary layer and the first polysilicon layer selectively with respect to the said second auxiliary layer, and the second auxiliary layer is formed from thermal $SiO_2$, for example by thermal oxidation. The spacers are then removed selectively with respect to the second auxiliary layer. While using the second auxiliary layer as an etching mask, the first polysilicon structure is formed by etching the first polysilicon layer. Finally, the second auxiliary layer is removed. Since use is not made of a mask, which would have to be aligned relative to the longitudinal trenches, in this self-aligning structuring of the first polysilicon layer, the first polysilicon layer can be structured more finely than would correspond to the minimum structure size F that can be produced with the respective technology.

For the purpose of improved insulation between adjacent rows, insulating spacers are formed on the sides of the first polysilicon structure prior to the deposition of the second dielectric layer.

The insulating effect of these insulating spacers can be improved by producing the longitudinal trenches in such a way that their sides have bulges in the region of the trench bottom, by virtue of which bulges the width of the trench is greater in the region of the trench bottom than in the region of the main area. Such a trench profile can be formed by combined anisotropic and isotropic etching or by exploiting the so-called barrelling effect. Barrelling effect is understood to mean the situation where a widening of the trench occurs in the region of the trench bottom during anisotropic plasma etching at elevated pressure. The barrelling effect is disclosed, for example, in VLSI Electronics, Microstructure Science, Volume 8, Plasma Processing for VLSI, N. G. Einspruch and D. M. Brown, Chapter 5, Academic Press Inc., Orlando, 1984, p. 124 ff. Once the first dielectric layer has been formed, the bulges are filled with insulating material.

BRIEF DESCRIPTION OF THE DRAWINGS

The invention, together with further objects and advantages, may best be understood by reference to the following description taken in conjunction with the accompanying drawings, in the several Figures of which like reference numerals identify like elements, and in which.

The invention is explained in more detail below using an exemplary embodiment and with reference to the figures.

DESCRIPTION OF THE PREFERRED EMBODIMENTS

Figure 1:
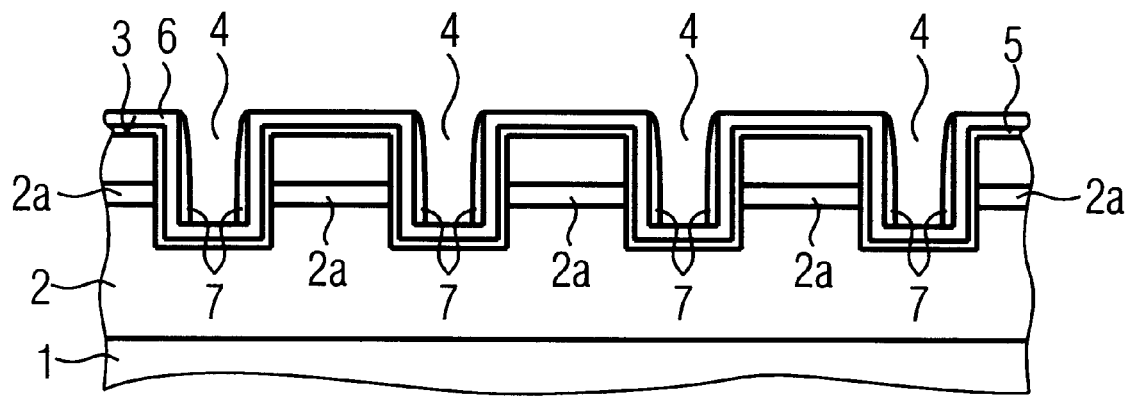
FIG. 1 shows a semiconductor substrate having a region doped by a first conductivity type, longitudinal trenches running parallel, a first dielectric layer, a first polysilicon layer and $Si_3N_4$ spacers.

A p-doped trough 2 is first produced, for example by masked implantation, in a substrate 1 made, for example, of monocrystalline silicon with a p-doping of $10^{16}$ cm$^{-3}$. The p-doped trough 2 has a dopant concentration of, for example, $10^{17}$ cm$^{-3}$. The p-doped trough 2 adjoins a main area 3 of the substrate 1 (see FIG. 1). It has a depth of, for example, 1.2 μm.

A p$^+$-doped layer 2a is produced in the p-doped trough 2 by implantation using boron. A dopant concentration of, for example, $2·10^{18}$ cm$^{-3}$ is set in the p$^+$-doped layer 2a.

A trench mask is produced by deposition of an $SiO_2$ layer in a TEOS process and its photolithographic structuring (not illustrated). Longitudinal trenches 4 are etched by anisotropic etching with $Cl_2$, for example, using the trench mask as an etching mask. The longitudinal trenches 4 have a depth of, for example, 0.4 μm. In this case, the bottom of the longitudinal trenches 4 lies in the p-doped trough 2. The width of the longitudinal trenches 4 is, for example, 0.4 μm and the length is, for example, 25 μm. The longitudinal trenches 4 run parallel over the substrate 1. Their extent and number are so large that they cover the region for memory cells to be produced later. 1024 longitudinal trenches are arranged next to one another, for example.

A dielectric layer 5 is subsequently formed from $SiO_2$ by thermal oxidation. The first dielectric layer 5 is formed with a thickness of, for example, 8 nm. The thickness of the first dielectric layer 5 is dimensioned here in such a way that voltages of 10 volts to 15 volts can bring about tunnelling currents which transfer, within microseconds to a few milliseconds, enough charge onto a floating gate (to be produced later) for the threshold voltage $V_t$ of the MOS transistor situated underneath to exceed the supply voltage $V_{dd}$.

A first polysilicon layer 6 is subsequently deposited with a thickness of, for example, 100 nm to 200 nm. The first polysilicon layer 6 is n-doped. This can be done either in situ during the deposition or after the deposition by means of phosphorus diffusion. The first polysilicon layer 6 has an essentially conformal edge covering, with the result that its thickness on the main area 3 and on the trench bottom is essentially the same as on the sides of the longitudinal trenches 4 (see FIG. 1).

An $Si_3N_4$ layer 7 with a thickness of, for example, 20 nm to 80 nm is applied to the doped first polysilicon layer 6. The $Si_3N_4$ layer has an essentially conformal edge covering. Anisotropic etching with $CHF_3$, for example, is carried out, during which those parts of the $Si_3N_4$ layer which are arranged in the planar regions are removed. $Si_3N_4$ spacers 7 are produced here which cover the first polysilicon layer 6 in the region of the sides of the longitudinal trenches 4 (see FIG. 1).

Figure 2:
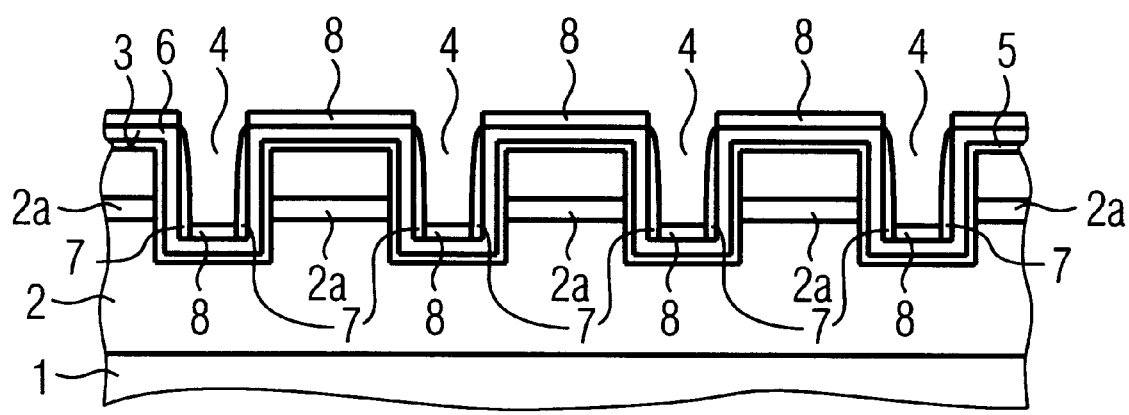
FIG. 2 shows the semiconductor substrate following the formation of a second auxiliary layer by thermal oxidation.

An $SiO_2$ structure 8 is produced selectively on the exposed surface of the first polysilicon layer 6 by thermal oxidation at, for example, 850° C. (see FIG. 2). Since the first polysilicon layer 6 was exposed in the region of the main area 3 and on the bottom of the longitudinal trenches 4 following the formation of the $Si_3N_4$ spacers 7, the $SiO_2$ structure 8 covers the first polysilicon layer 6 in the region of the main area 3 and on the bottom of the longitudinal trenches 4.

The $Si_3N_4$ spacers 7 are subsequently removed selectively with respect to the $SiO_2$ layer 8. This is done, for example, wet-chemically with the aid of hot phosphoric acid. In this case, those parts of the first polysilicon layer 6 which are arranged in the region of the sides of the longitudinal trenches 4 are exposed.

Figure 3:
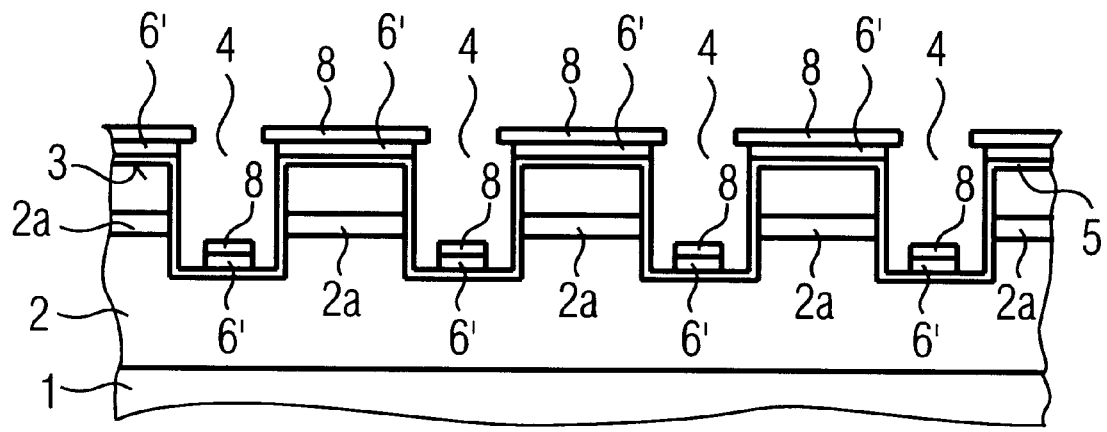
FIG. 3 shows the semiconductor substrate following selective removal of the $Si_3N_4$ spacers and following structuring of the first polysilicon layer.

While using the $SiO_2$ structure 8 as an etching mask, the first polysilicon layer 6 is structured by dry etching, which can be combined with wet etching. This produces a first polysilicon structure 6'. The etching is done, for example, with $Cl_2$ or with $HF/HNO_3$. During the structuring of the first polysilicon layer 6, those parts of the first polysilicon layer 6 which are arranged in the region of the sides of the longitudinal trenches 4 are removed. The first polysilicon structure 6' therefore comprises strip-like parts which are each arranged in the region of the main area between adjacent longitudinal trenches 4 and on the bottom of the longitudinal trenches (see FIG. 3). The first polysilicon structure 6' is formed in a self-aligning manner, that is to say without the use of photolithography.

The $SiO_2$ structure 8 is removed by dry etching, for example with $CF_4$. The etching preferably takes place selectively with respect to polysilicon.

Figure 4:
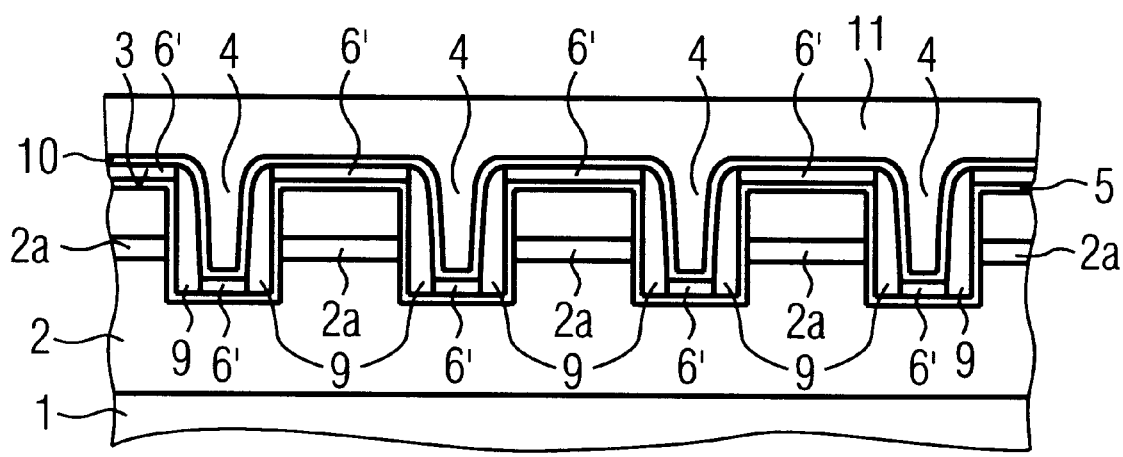
FIG. 4 shows the semiconductor substrate following removal of the second auxiliary layer and following deposition and structuring of a second dielectric layer and a second polysilicon layer.

$SiO_2$ spacers 9 are formed by the deposition of an $SiO_2$ layer with the aid of a TEOS process to a thickness of, for example, 30 nm to 100 nm and subsequent anisotropic etching of the $SiO_2$ layer and etching back by the thickness of the first polysilicon layer (see FIG. 4). The etching is done, for example, with $CF_4$. The $SiO_2$ spacers 9 are arranged in the region of the sides of the longitudinal trenches 4. They likewise cover the exposed region on the bottom of the longitudinal trenches 4.

A second dielectric layer 10 is produced following a pretreatment of the surface of the first polysilicon structure 6', for example by reductive cleaning with HF. The second dielectric layer 10 is formed, for example, by thermal oxidation of a layer of $SiO_2$ to a layer thickness of, for example, 14 nm. Alternatively, the second dielectric layer 10 is formed as a multiple layer having an $SiO_2$—$Si_3N_4$—$SiO_2$ layer sequence. For this purpose, an $SiO_2$ layer is first deposited to a layer thickness of, for example, 5 nm. Deposited on top of this is an $Si_3N_4$ layer with a layer thickness of, for example, 7 nm. A further $SiO_2$ layer with a layer thickness of, for example, 5 nm is subsequently formed by thermal oxidation. A further option for a suitabe second dielectric is constituted by the use of nitrided oxide.

A second polysilicon layer 11 is subsequently deposited (see FIG. 4). The second polysilicon layer 11 is formed with a thickness which is greater than half the width of the longitudinal trenches 4. As a result, the second polysilicon layer 11 has an essentially planar surface. The second polysilicon layer 11 is formed with a thickness of, for example, 300 nm.

Once a photoresist mask (not illustrated) has been formed, the second polysilicon layer 11 is structured by anisotropic etching. Word lines 11', which run transversely with respect to the longitudinal trenches 4, are formed here. The second polysilicon layer 11 is anisotropically etched, for example, with $Cl_2$. By changing the etchant to $CF_4$, the second dielectric layer 10 is structured using the same photoresist mask. By changing the etchant to $Cl_2$ again, the first polysilicon structure 6' is structured, the surface of the first dielectric layer 5 and of the $SiO_2$ spacers 9 being exposed (see FIG. 5). The word lines 11' are formed with a width of, for example, 0.4 $\mu$m and with a spacing between adjacent word lines 11' likewise of 0.4 $\mu$m, for example.

Figure 5:
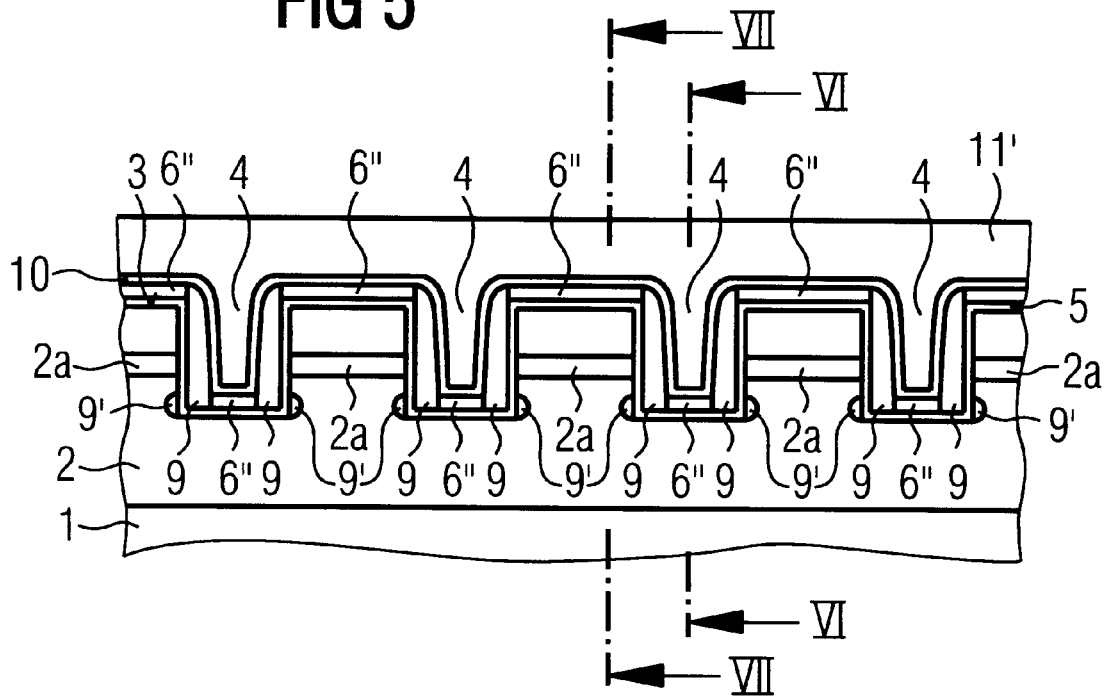
FIG. 5 shows the semiconductor substrate following formation of control gates and word lines and following formation of the source/drain regions.
Figure 6:
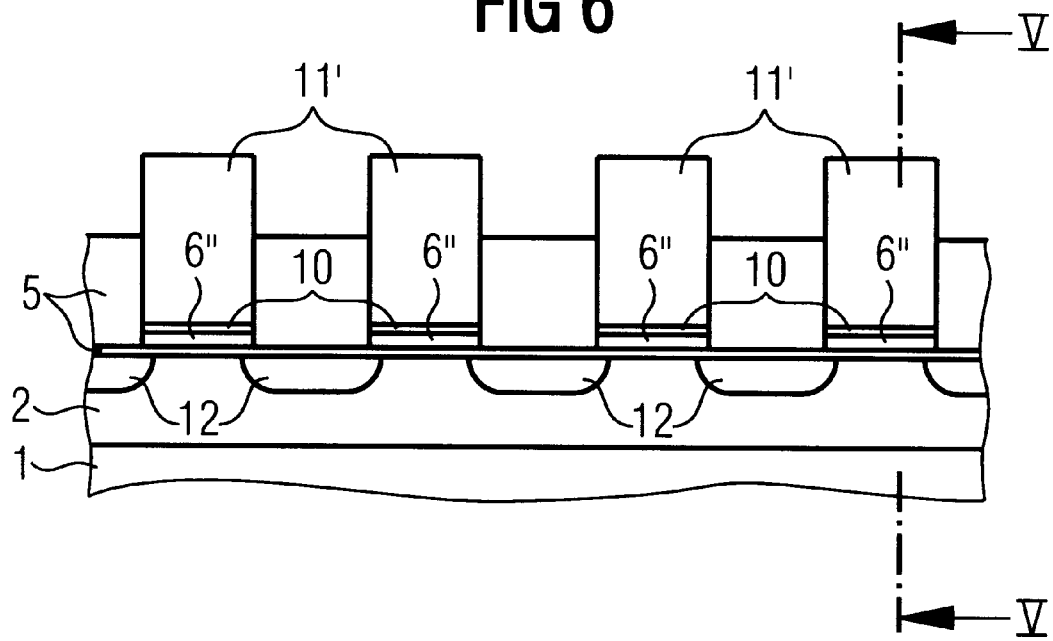
FIG. 6 shows the section designated by VI—VI in FIG 5.
Figure 7:
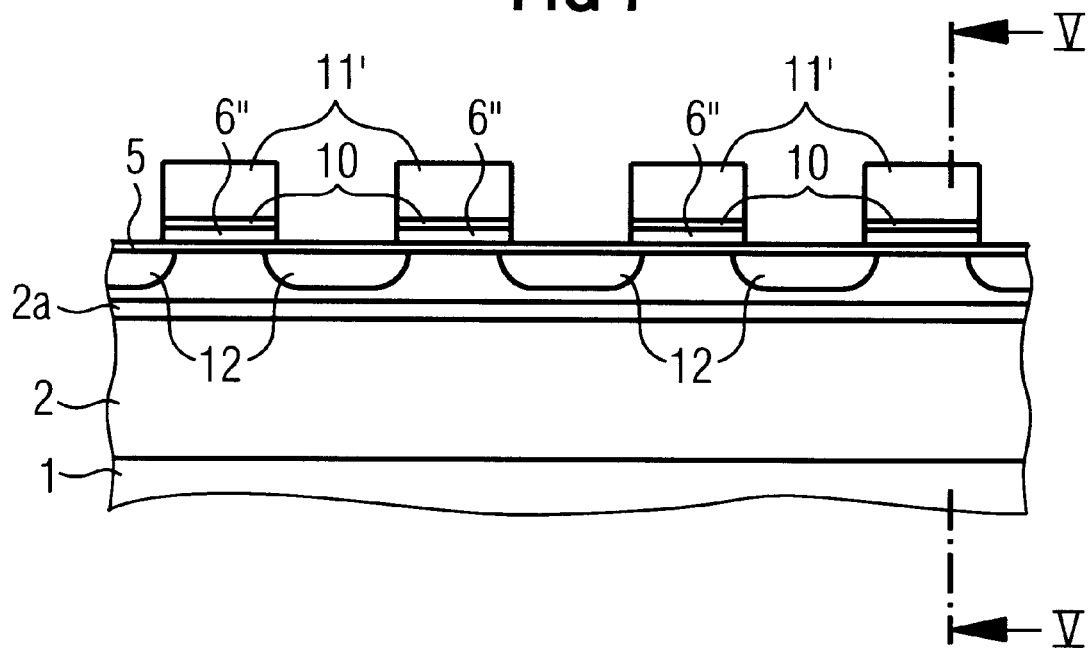
FIG. 7 shows the section designated by VII—VII in FIG. 5.

After the photoresist mask has been removed, source/drain implantation is effected with, for example, arsenic and an energy of, for example, 25 keV and a dose of, for example, $5 \times 10^{15}$ cm$^{-2}$. Doped regions 12 are produced on the bottom of the longitudinal trenches 4 and in the main area 3 between the longitudinal trenches 4 during the source/drain implantation (see FIG. 5, FIG. 6, which illustrates the section through FIG. 5 designated by VI—VI, and FIG. 7, which illustrates the section designated by VII—VII in FIG. 5. The section illustrated in FIG. 5 is designated by V—V both in FIG. 6 and in FIG. 7). The doped regions 12 in each case act as a common source/drain region for two adjacent MOS transistors arranged along a row. The word lines 11' are simultaneously doped during the source/drain implantation.

The memory cell arrangement is completed by the deposition of an intermediate oxide, in which contact holes are opened with the aid of photolithographic process steps, and the formation of contacts by applying a metal layer, for example by sputtering, and subsequently structuring the metal layer.

In this case, each row at the edge of the read-only memory cell arrangement is provided with two connections, between which the MOS transistors arranged in the row are interconnected in series (not illustrated).

During the structuring of the first polysilicon structure 6', floating gates 6" are produced which are respectively arranged underneath a word line 11'.

Each two adjacent doped regions 12 and the word line 11' arranged inbetween in each case form an MOS transistor. That part of the p-doped trough 2 which is arranged between the two doped regions 12 forms the channel region of the MOS transistor. Arranged above the channel region are the first dielectric layer 5 as the tunnel oxide, the floating gate 6", the second dielectric 10 and a control gate, which is formed from that part of the word line 11' which runs above the channel region.

A row of MOS transistors which are interconnected in series and are each formed from two doped regions 12 and the word line 11' arranged inbetween is in each case arranged on the bottom of the longitudinal trenches 4 and between the longitudinal trenches 4 in the region of the main area 3. The MOS transistors arranged on the bottom of a longitudinal trench 4 are insulated from the adjacent MOS transistors arranged between the longitudinal trenches 4 on the main area by means of the $SiO_2$ spacer 9.

The maximum insulation voltage is given here by the extent of the $SiO_2$ spacer 9 parallel to the main area. In order to improve the insulation, this extent of the $SiO_2$ spacer 9 can be enlarged by the sides of the longitudinal trenches 4 having a bulge 9' in the region of the trench bottom, which bulge is likewise filled with $SiO_2$. A bulge of this type can be produced in a self-aligned manner by exploiting the barrelling effect during the etching of the longitudinal trenches 4. After the first dielectric layer 5 has been produced, the bulges are filled by deposition and anisotropic etching back of an additional TEOS—$SiO_2$ layer having a layer thickness of about 20 nm to 80 nm.

Figure 8:
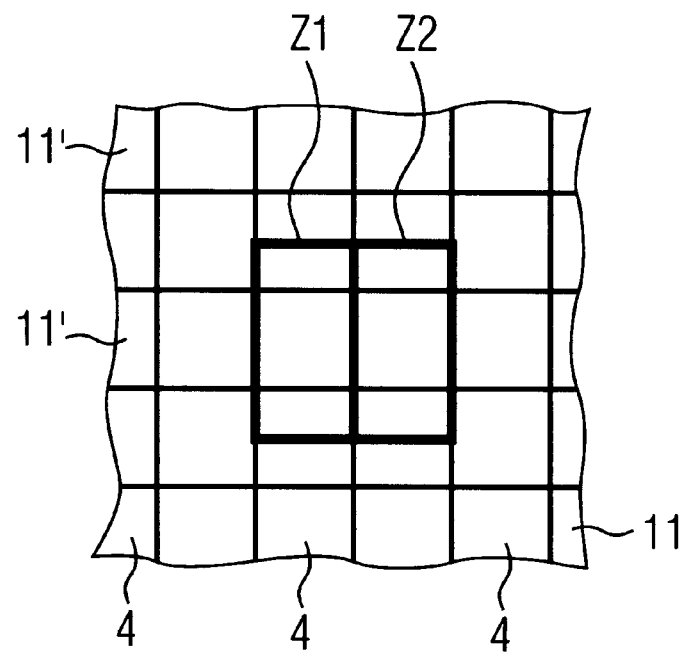
FIG. 8 shows a plan view of the semiconductor substrate.

The width of the longitudinal trenches 4, the spacing between adjacent longitudinal trenches 4, the width of the word lines 11' and the spacing between adjacent word lines 11' are in each case preferably formed with a dimension corresponding to a minimum structure size F that can be produced with the respective technology. If account is taken of the fact that each of the doped regions 12 is the source/drain region for two adjoining MOS transistors, then the length of each MOS transistor parallel to the course of the longitudinal trenches 4 is 2F. The width of the MOS transistors is F in each case. The area for a memory cell formed from an MOS transistor is therefore $2F^2$, dictated by production. Memory cells which are adjacent along a word line 11' and whose contours Z1, Z2 are illustrated as an emboldened line in the plan view in FIG. 8 adjoin one another directly when projected onto the main area 3. The memory cell Z1 is arranged on the bottom of one of the longitudinal trenches, whereas the memory cell Z2 is arranged on the main area 3 between two adjacent longitudinal trenches 4. As a result of the vertically offset arrangement of adjacent memory cells, the packing density is increased without the insulation between adjacent memory cells being impaired.

The electrically writable and erasable read-only memory cell arrangement is programmed by injecting electrons from the channel region of the respective MOS transistor onto the associated floating gate 6". Depending on the electric charge situated on the floating gate 6", the corresponding MOS transistor has a low or a high threshold voltage. A high threshold voltage, which is assigned to a first logic value, is brought about by a positive voltage of, for example, 10 to 15 volts, which is applied between the word line 11', which acts as the control gate, and the p-doped trough 2, which is insulated from the substrate 1 by a pn junction. This voltage causes electrons to be injected onto the floating gate by way of a Fowler/Nordheim tunnelling current.

A second logic value is assigned to a low threshold voltage. The corresponding floating gate 6" is discharged for this purpose. This is done by applying a negative potential of −10 to −15 volts between the p-doped trough 2 and the control gate 11'. This produces a tunnelling current through the first dielectric layer 5, by way of which current the electrons flow away from the floating gate 6" within microseconds to a few milliseconds.

By using a plurality of voltage levels during the injection of electrons onto the floating gate 6", the electrically writable and erasable memory cell arrangement can also be programmed in the sense of multi-value logic.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is claim:

1. A method for producing an electrically writable and erasable read-only memory cell arrangement, comprising the steps of:

producing a region, which is doped by a first conductivity type and insulated from a semiconductor substrate, in a main area of the semiconductor substrate, etching longitudinal trenches, which run substantially parallel, in the main area within the region doped by the first conductivity type;

producing a multiplicity of memory cells arranged in rows, each of the memory cells having at least one MOS transistor having source/drain regions which are doped by a second conductivity type opposite to the first, a first dielectric, a floating gate, a second dielectric and a control gate, the rows being arranged alternately on the main area between adjacent longitudinal trenches and on respective bottoms of the longitudinal trenches;

producing a first dielectric layer;

producing and structuring a first doped polysilicon layer such that strip-like first polysilicon structures are produced which are arranged parallel to the longitudinal trenches on the main area between adjacent longitudinal trenches and on respective bottoms of the longitudinal trenches, for self-alligned structuring of the first polysilicon layer, forming spacers on those parts of the first polysilicon layer which are arranged on side of the longitudinal trenches, by deposition and anisotropic etching, which is selective with respect to the semiconductor substrate, of a first auxiliary layer, producing a second auxiliary layer selectively on exposed parts of the first polysilicon layer, the first auxiliary layer and the first polysilicon layer being selectively etched with respect to the second auxiliary layer, removing the spacers selectively with respect to the second auxiliary layer, forming the first polysilicon structure by etching the first polysilicon layer using the second auxiliary layer as an etching mask, removing the second auxiliary layer;

producing a second dielectric layer;

producing control gates and word lines, which run transversely with respect to the rows and are each connected to the control gates of MOS transistors arranged along different rows, by deposition and anisotropic etching of a second polysilicon layer;

structuring the second dielectric layer and the first polysilicon structure by anisotropic etching corresponding to the word lines;

effecting source/drain implantation for the MOS transistors, during which the word lines act as a mask.

2. The method according to claim 1, wherein the longitudinal trenches are produced such that sides thereof have bulges in a region of the trench bottom, by which bulges a width of the trench is greater in the region of the trench bottom than in a region of the main area, wherein the bulges are filled with insulating material.

3. The method according to claim 1, wherein the longitudinal trenches are formed by combined anisotropic and isotropic etching.

* * * * *